United States Patent [19]

Mizutani

[11] Patent Number: 5,269,876
[45] Date of Patent: Dec. 14, 1993

[54] PROCESS FOR PRODUCING CRYSTAL ARTICLE

[75] Inventor: Hidemasa Mizutani, Sagamihara, Japan

[73] Assignee: Canon Kabushiki Kaisha, Tokyo, Japan

[21] Appl. No.: 22,834

[22] Filed: Feb. 25, 1993

Related U.S. Application Data

[63] Continuation of Ser. No. 724,456, Jul. 3, 1992, abandoned, which is a continuation of Ser. No. 596,753, Oct. 15, 1990, abandoned, which is a continuation of Ser. No. 146,724, Jan. 21, 1988, abandoned.

[30] Foreign Application Priority Data

Jan. 26, 1987 [JP] Japan .................................. 62-14102

[51] Int. Cl.$^5$ ............................................. C30B 23/04
[52] U.S. Cl. .................... 156/612; 156/610; 156/DIG. 64; 437/20; 437/61
[58] Field of Search ............... 156/610, 612, 613, 614, 156/DIG. 64, DIG. 99, DIG. 111, 610; 437/62, 67, 20, 68, 83, 90, 238, 241, 946, 61; 148/DIG. 50, DIG. 114, DIG. 152

[56] References Cited

U.S. PATENT DOCUMENTS

| | | | |
|---|---|---|---|
| 3,620,833 | 11/1971 | Gleim et al. | 117/212 |
| 3,634,150 | 1/1972 | Horn | 156/613 |
| 4,069,094 | 1/1978 | Shaw et al. | 156/613 |
| 4,141,765 | 2/1979 | Druminski et al. | 156/612 |
| 4,279,688 | 7/1981 | Abrahams et al. | 156/613 |
| 4,371,421 | 2/1983 | Fan et al. | 156/624 |
| 4,578,142 | 3/1986 | Corboy, Jr. et al. | 156/612 |

OTHER PUBLICATIONS

Ogawa et al., "The Selective Epitaxial Growth of Silicon by Using Silicon Nitride Film as a Mask", Jap. J. Appl. Phys. vol. 10, No. 12 (1971), pp. 1675-1679.
Claassen et al., "The Nucleation of CVD Silicon on $SiO_2$ and $Si_3N_4$ Substrates," J. Electrochem. Soc. vol. 127, No. 1 (1980), pp. 194-202.
Jastrzebski, "SOI by CVD:Epitaxial Lateral Overgrowth (ELO) Process-Review", J. Crys. Growth 63 (1983) pp. 493-526.
CA 83 (2) 20826r "Composition for Polishing Semiconductor Materials" by Kow et al. 1975.
Filby et al. "Single-Crystal Films of Silicon on Insulators" Brit. J. Appl. Phys. vol. 18 1967 pp. 1357-1382.
Calclaser, R. A. "Microelectronics Processing and Device Design" Wiley & Sons 1980 p. 76.

Primary Examiner—R. Bruce Breneman
Attorney, Agent, or Firm—Fitzpatrick, Cella, Harper & Scinto

[57] ABSTRACT

A process for producing a crystal article comprises the step of preparing a substrate having a concavity and a nucleation surface provided thereon, said nucleation surface being constituted of a material which is sufficiently greater in nucleation density than the material constituting the bottom surface of the concavity and having a surface area which is sufficiently small to the extent such only a single nucleus can grow, the step of forming a single nucleus on said nucleation surface and permitting a single crystal to grow by applying crystal growth treatment onto said nucleus, and the step of removing the surface portion of the crystal formed over the upper surface of the convexity of said substrate by selective polishing.

1 Claim, 9 Drawing Sheets

PROCESS FOR PRODUCING CRYSTAL ARTICLE

This application is a continuation of application Ser. No. 07/724,456 filed Jul. 3, 1991, now abandoned, which is a continuation of application Ser. No. 07/596,753 filed Oct. 15, 1990, now abandoned, which is a continuation of application Ser. No. 07/146,724, filed Jan. 21, 1988, which is now abandoned.

BACKGROUND OF THE INVENTION

1. Field of the Invention

This invention relates to a process for producing a crystal article.

The present invention can be suitably used for, for example, SOI technique.

2. Related Background Art

In the prior art, the single crystalline thin film to be used for semiconductor electronic device, photoelectric device, etc. has been formed by epitaxial growth on a single crystalline substrate. However, for epitaxial growth of a single crystalline thin film on a single crystalline substrate, it is necessary to consider matching in lattice constant and coefficient of thermal expansion between the single crystalline material of the substrate and the epitaxial growth layer, and there has been involved the problem that the kinds of the substrate material were limited to extremely narrow scope for formation of a single crystalline layer capable of preparing a device of good quality.

On the other hand, in recent years, research and development have been actively done in three-dimensional integrated circuits for accomplishing high integration and multi-functionality by forming semiconductors by lamination in the direction normal to the substrate, as well as research and development for a large area semiconductor device such as a solar battery in which elements are arranged in an array on an inexpensive glass or switching transistor of liquid crystal picture elements, etc. and are becoming more active year by year.

What is common in these researches and developments, is that the technique to form a semiconductor film on an amorphous insulating material and form an electronic element such as transistor, etc. thereon is required. Among them, it has been particularly desired to have a technique to form a single crystalline semiconductor of high quality on an amorphous insulating material.

However, generally speaking, when a thin film is formed on an amorphous insulating substrate such as $SiO_2$, etc., due to deficiency of long length order of the substrate material, the crystal structure of the deposited film becomes amorphous or polycrystalline, whereby it was very difficult to form a single crystalline semiconductor of high quality. Here, amorphous film refers to one with the state in which short length order to the minimum extent on the order of atom may be maintained, but there is no longer length order, while polycrystalline film refers to one in which single crystal grains having no specific crystal direction are gathered as separated with grain boundaries.

As a solution to the problems as mentioned above in the prior art, European Patent Application EP 244081 A1 proposes a method for forming a crystal by permitting a single crystal to grow on the single nucleus as the growing center, on the nucleation surface ($S_{NDL}$) provided on a substrate surface which is constituted of a material sufficiently larger in nucleation density (ND) than the material constituting said substrate surface and has an area sufficiently small to the extent that only a single crystal can be grown, and by use of this method, it is possible to form a single crystal also on an insulating amorphous substrate.

In the invention shown in the above European Patent Application, when a single crystalline layer is formed on a substrate, a facet inherent in single crystal is generated, and therefore flattening is required for formation of a circuit element on the single crystalline layer. Particularly, when a concavity is formed on the substrate and a single crystal is formed in said concavity, it is necessary to remove the single crystal with good precision in conformity with the upper surface of the substrate in order to improve precision of fine working.

SUMMARY OF THE INVENTION

An object of the present invention is to provide a process for producing a crystal article which enables the removal of the surface portion of a crystal such as single crystal, etc. formed in the concavity efficiently and at high precision.

The process for producing the crystal article of the present invention is a process comprising the step of preparing a substrate having a concavity and a nucleation surface provided thereon, said nucleation surface being constituted of a material which is sufficiently greater in nucleation density than the material constituting the bottom surface of the concavity and having a surface area which is sufficiently small to the extent such that only a single nucleus can grow, the step of forming a single nucleus on said nucleation surface and permitting a single crystal to grow by applying crystal growth treatment onto said nucleus, and the step of removing the surface portion of the crystal formed over the upper surface of the convexity of said substrate by selective polishing.

DESCRIPTION OF THE PREFERRED EMBODIMENTS

Referring now to the accompanying drawings, the embodiments of the present invention are described in detail.

Figure 1A:
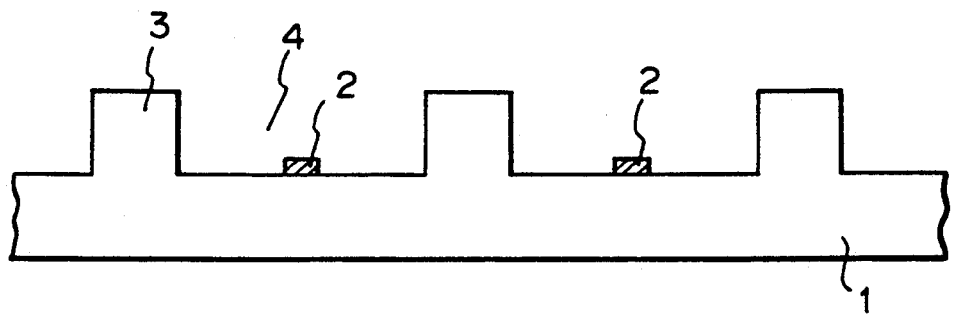
FIGS. 1(A)–1(C) are schematic illustrations of the production steps showing an embodiment of the crystal article according to the present invention.
Figure 1B:
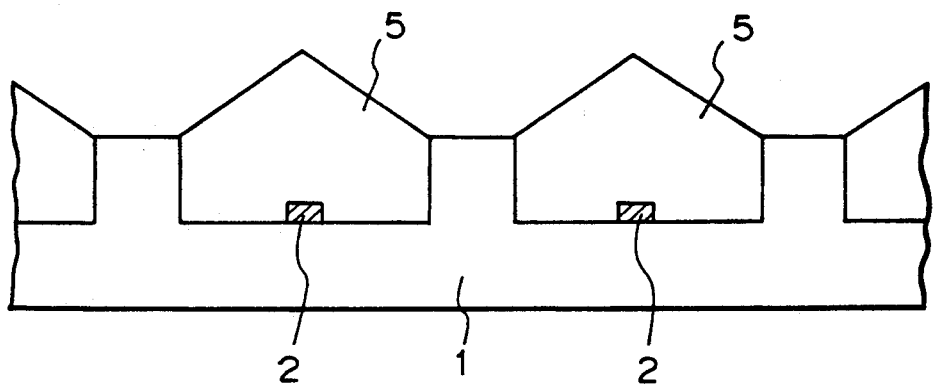
Figure 1C:
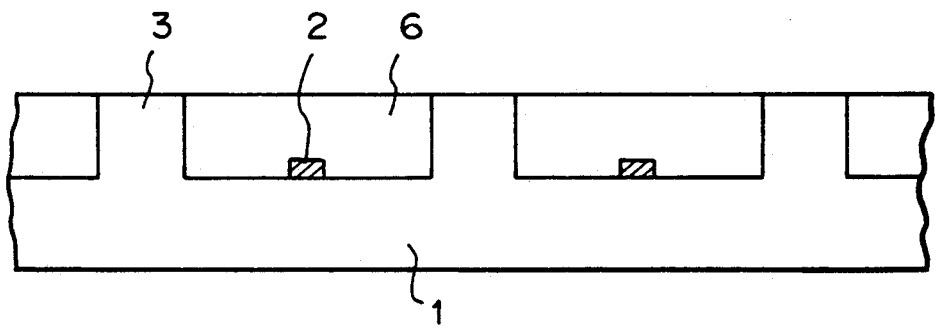
Figure 2:
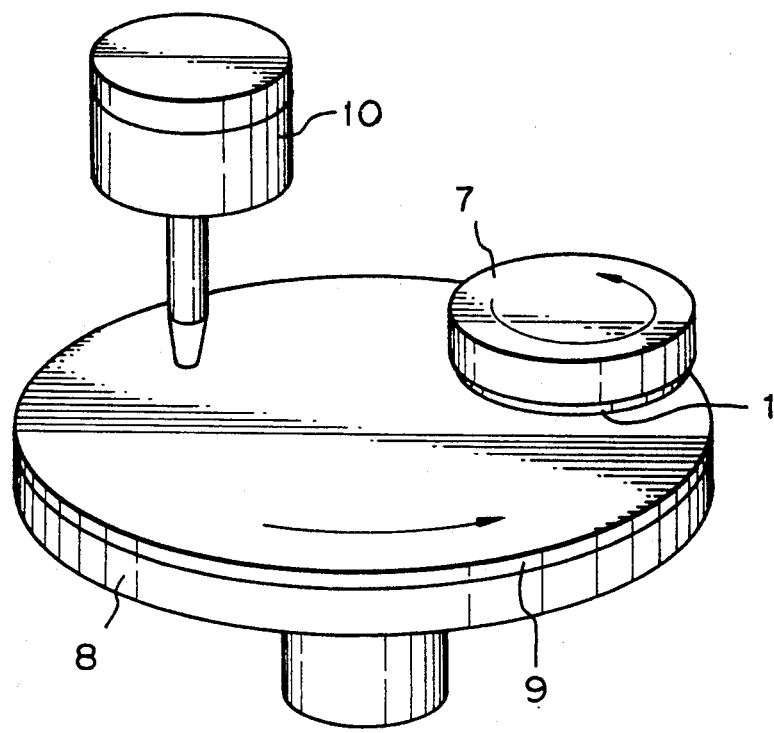
FIG. 2 is a schematic perspective view of the polishing device for illustration of the selective polishing method to be used in the process for production of the crystal artice of the present invention.

FIGS. 1(A)–1(C) are schematic preparation step diagrams showing an embodiment of the process for producing the crystal article according to the present invention, and FIG. 2 is a schematic perspective view for illustration of the selective polishing method to be used in the process for producing the crystal article of the present invention.

First, as shown in FIG. 1(A), concavities 4 are formed with the side wall portions 3 remained on a substrate 1 of SiO$_2$ (silicon oxide), etc. by photoetching, etc. Then, on the surface of the substrate is deposited, for example, a deposition film for formation of a single nucleus such as Si$_3$N$_4$ (silicon nitride) with a thickness of about 300 A according to the reduced pressure CVD method, etc. And, by plasma etching after resist patterning, the SiO$_2$ surface is exposed with leaving Si$_3$N$_4$ films 2 with a small area at the central portions of the concavities 4 while removing other portions.

Next, as shown in FIG. 1(B), with the Si$_3$N$_4$ film 2 as the center, single nuclei of Si are permitted to grow, and single crystals of Si are permitted to grow from the single nuclei. At this time, particular facets exist in the single crystals 5 and crystal growth occurs along that facet, and therefore when permitted to grow until completely embedding the concavity 4, a part will grow over the upper surface of the convexity of the substrate 1.

Finally, as shown in FIG. 1(C), the single crystal at the part surpassing over the upper surface of the convexity of the substrate is removed by use of the selective polishing method to form single crystal regions 6.

The selective polishing method is reported in Research Report SSD86-63 of Society of Electrical Communication, which is a polishing method comprising a combination of mechanical polishing and chemical polishing, which has improved working speed to great extent and enabled high precision polishing. In the following, this selective polishing method is to be explained. As shown in FIG. 2, the substrate 1 having a single crystal provided at the concavity is fixed with wax on the supporting plate 7 and pressed against the polishing pad 9 made of a polyester provided on the rotatory disc 8, and subjected to rotatory working through ethylenediamine pyrocatechol fed from the polishing liquid feeding source 10. At this time, Si reacts with amine and water to form SI(OH)$_6{}^{-2}$, which is removed by the polishing pad 9, whereby polishing of Si will proceed. As the polishing proceeds until reaching the upper surface of the side wall portion 3 of SiO$_2$, polishing will be automatically stopped with SiO$_2$ being as the stopper. As the result, as shown in FIG. 1(C), highly precise working is effected so that the surface of the single crystal region 6 and the upper surface of the side wall portion of SiO$_2$ may be on substantially the same plane.

According to the process for producing the crystal article of the present invention, since the single crystal deposited over the upper surface of the substrate can be removed according to a simple working, and also the crystal article can be formed with its surface flattened, fine working of photolithography, etc. when forming a circuit device by use of the crystal article can be effected with high precision, whereby integration can be done with ease.

In the above embodiment, the case of a single crystal is shown as the crystal, but the process can be similarly used also for polycrystalline film, etc.

Figure 3:
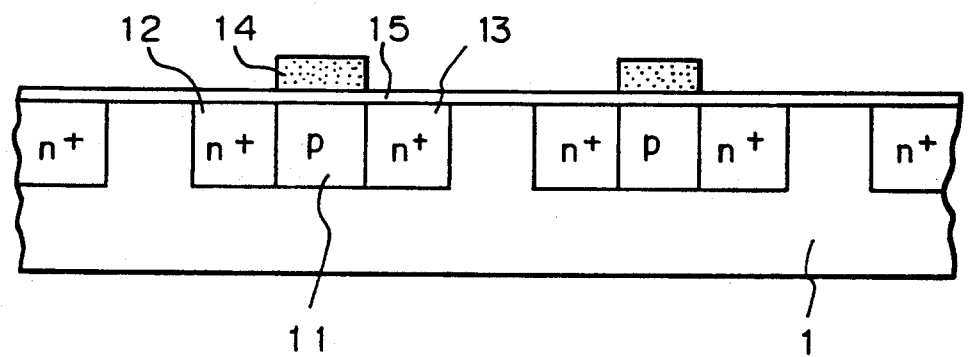
FIG. 3 is a schematic sectional view of the MOS type transistor using the crystal article according to the present invention.

FIG. 3 is a schematic sectional view of the MOS type transistor using the crystal article according to the present invention.

In FIG. 3, 11 is a P-type semiconductor region, which can be formed by doping with a P-type impurity during formation of the single crystal in the production step shown in FIG. 1. 12 and 13 are N-type semiconductor regions, forming source and drain, respectively. 15 is the gate oxide film formed on the P-type semiconductor region 11 and N-type semiconductor regions 12 and 13, and 14 is the gate electrode formed on the gate oxide film 15.

Since the MOS type transistor produced according to the present invention already has the SiO$_2$ layer as the side wall portion formed thereon, it is not necessary to introduce the separation process of the respective transistors, with the respective transistors being completely separated with insulating layers, and therefore it has the advantage of being free from latch-up or α-ray disorder.

The production steps of the MOS type transistor are omitted here, because it can be formed according to conventional semiconductor process.

Next, the single crystal growth method for permitting a single crystal silicon to grow at the concavity 4 on the substrate 1 is to be described in detail. As such single crystal growth method, one of the methods as disclosed in the above European Patent Application can be employed. First, for better understanding of such single crystal growth method, general thin film forming process of a metal or a semiconductor is to be explained.

When the deposition surface is of a material different in kind from the flying atoms, particularly an amorphous material, the flying atoms will be freely diffused on the substrate or reevaporated (eliminated). And, as the result of collision mutually between the atoms, a nucleus is formed, and when the nucleus reaches the size rc ($=-2\sigma_0/gv$) at which its free energy G becomes the maximum (critical nucleus), G is reduced and the nucleus continues to grow three-dimensionally and becomes shaped in an island. The nucleus with a size exceeding rc is called "stable nucleus" and in the basic description of the present invention hereinbelow, "nucleus" unless otherwise specifically noted indicates the "stable nucleus".

Also, of the "stable nucleus", one with small r is called "initial nucleus". The free energy G formed by formation of the nucleus is represented by:

$$G = 4\pi f(\theta)(\sigma_0 r^2 + \tfrac{1}{3} gv\, r^3)$$

$$f(\theta) = \tfrac{1}{4}(2 - 3\cos\theta + \cos^2\theta)$$

where
r: radius of curvature of nucleus
θ: contact angle of nucleus
gv: free energy per unit deposition $\sigma_0$: surface energy between nucleus and vacuum.

Figure 4:
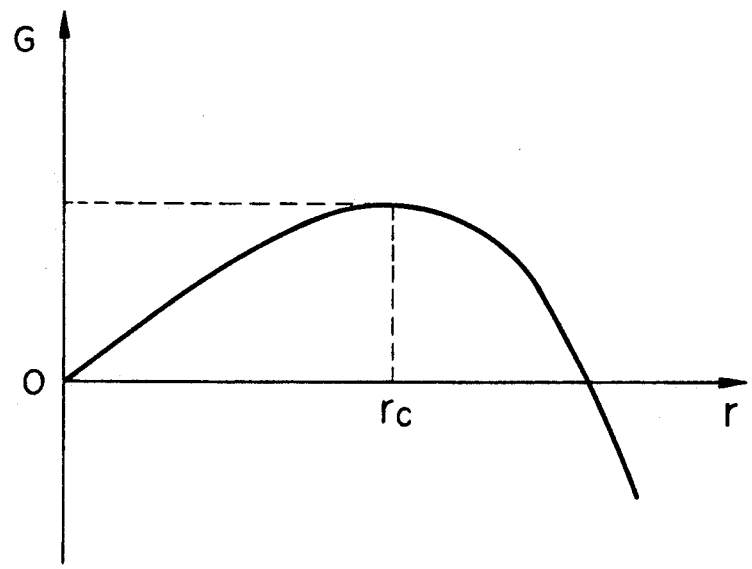
FIG. 4 is a graph showing the manner in which the free energy G of nucleus varies.

The manner in which G varies is shown in FIG. 4. In FIG. 4, the curvature of radius of the stable nucleus when G is at the maximum value is rc.

Thus, the nucleus grows to become shaped in an island, and further grows until contact mutually between islands proceeds, giving rise to coalescence in some cases, finally forming via a network structure a continuous film to cover completely the substrate surface. Through such process, a thin film is deposited on the substrate.

In the deposition process as described above, the density of the nucleus formed per unit area of the substrate surface, the size of the nucleus and the nucleation speed are determined depending on the state of the system of deposition, and particularly the interaction between the flying atoms and the substrate surface substance is an important factor. Also, a specific crystal direction grows in parallel to the substrate depending on the anisotropy relative to the crystal face of the interfacial energy at the interface between the deposited substance and the substrate, and when the substrate is amorphous, the crystal directions within the substrate plane are not constant. For this reason, a grain boundary is formed by collision mutually between nuclei or islands. Particularly, with collision mutually between islands with certain sizes or greater, coalescence will occur, leading directly to formation of a grain boundary. The grain boundary formed can be migrated with difficulty in the solid phase, and therefore the grain size is determined at that point.

Next, the selective deposition method for forming selectively a deposited film on the deposition surface is to be described. The selective deposition method is a method in which a thin film is selectively formed on the substrate by utilizing the difference between the materials in the factors influencing nucleation in the thin film forming process such as surface energy, attachment coefficient, elimination coefficient, surface diffusion speed, etc.

Figure 5A:
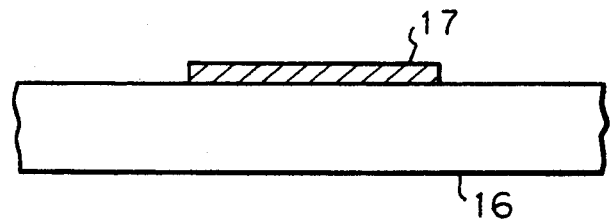
FIGS. 5(A) and 5(B) are diagrams for illustration of the selective deposition method.
Figure 5B:
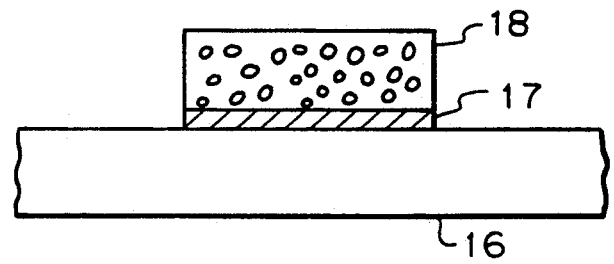

FIGS. 5(A) and 5(B) illustrate schematically the selective deposition method. First, as shown in FIG. 5(A), on the substrate 16, a thin film 17 of a material different in the above factors from the substrate 16 is formed at a desired portion. And, when deposition of a thin film comprising an appropriate material is performed according to appropriate deposition conditions, it becomes possible to cause a phenomenon to occur such that the thin film 18 will grow only on the thin film 17 without growth on the substrate 16. By utilizing this phenomenon, the thin film 18 formed self-matchingly can be permitted to grow, whereby the lithography step by use of a resist as practiced in the prior art can be omitted.

As the materials which can be deposited by such selective formation method, there may be included, for example, $SiO_2$ as the substrate 16, Si, GaAs or silicon nitride as the thin film 17, and Si, W, GaAs, InP, etc. as the thin film 18 to be deposited.

Figure 6:
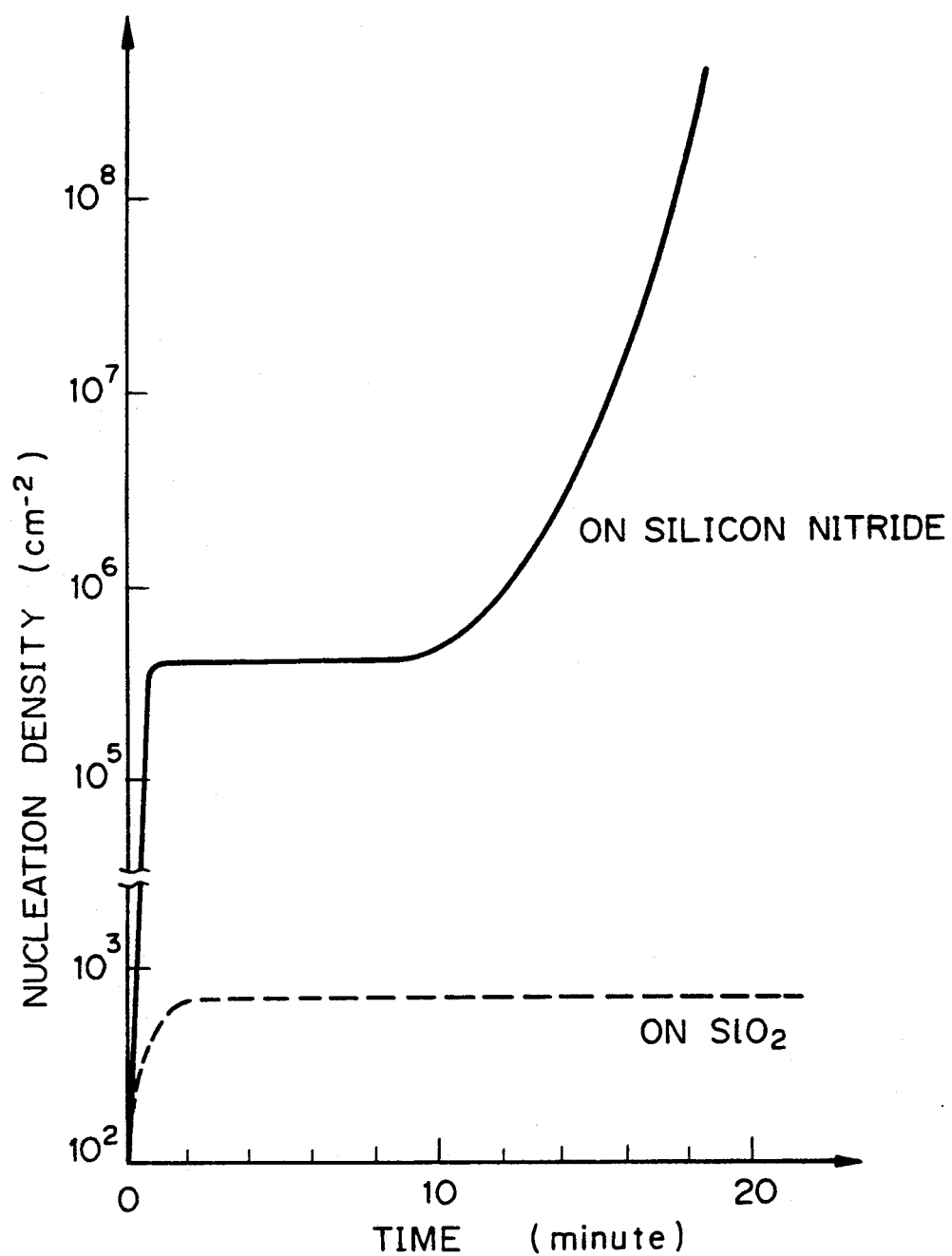
FIG. 6 is a graph showing the changes in nucleation density (ND) with lapse of time on the deposition surface of $SiO_2$ and the deposition surface of silicon nitride.

FIG. 6 is a graph showing the changes in nucleation density (ND) with lapse of time on the deposition surface of $SiO_2$ and the deposition surface of silicon nitride.

As shown in FIG. 6, soon after initiation of deposition, the nucleation density (ND) on $SiO_2$ is saturated at less than $10^3$ cm$^{-2}$, and its value is substantially unchanged even after 20 minutes.

In contrast, on silicon nitride ($Si_3N_4$), the density is saturated once at $4 \times 10^5$ cm$^{-2}$, and is not changed for 10 minutes thereafter, but will be sequentially abruptly increased. In this measurement example, there is shown the case in which $SiCl_4$ gas is diluted with $H_2$ gas, and deposited according to the CVD method under the conditions of a pressure of 175 Torr, a temperature of 1000° C. Otherwise, the same effect can be obtained by using $SiH_4$, $SiH_2Cl_2$, $SiHCl_3$, $SiF_4$, etc. as the reactive gas and controlling pressure, temperature, etc. Also, vacuum vapor deposition may be available.

In this case, although nucleation on $SiO_2$ poses substantially no problem, nucleation on $SiO_2$ can be further inhibited by addition of HCl gas in the reactive gas, whereby deposition of Si on $SiO_2$ can be made zero.

Such phenomenon owes greatly to the difference in adsorption coefficient, elimination coefficient, surface diffusion coefficient, etc. relative to Si between the material surfaces of $SiO_2$ and silicon nitride, but it may be also considered as a cause for selective deposition that $SiO_2$ itself is etched through the reaction of $SiO2$ with Si atom itself to form silicon monooxide with high vapor pressure, while no such etching phenomenon occurs on silicon nitride (T. Yonehara, S. Yoshioka, S. Miyazawa, *Journal of Applied Physics* 53, 6839, 1982).

Thus, by selecting $SiO_2$ and silicon nitride as the materials on the deposition surface and selecting silicon as the material to be deposited, sufficiently great nucleation density difference ($\Delta ND$) as shown in FIG. 6 can be obtained. Here, although $SiO_2$ is desirable as the material of the deposition surface, this is not limitative since $SiO_x$ ($0 < x < 2$) can also obtain sufficiently practical nucleation density difference.

Of course, the present invention is not limited by these materials, but the nucleation density difference ($\Delta ND$) may be sufficiently $10^3$-fold or more in terms of the density of nucleus as shown in the same graph, and sufficient selective formation of a deposited film can be performed with the materials as exemplified below.

As another method for obtaining such nucleation density difference ($\Delta ND$), a region containing excessively Si, N, etc. may be also formed by ion implantation of Si, N, etc. locally on the $SiO_2$ surface.

The present invention utilizes the selective deposition method based on such nucleation density difference ($\Delta ND$), and a deposition surface comprising a material of different kind with sufficiently greater nucleation density than the material of the deposition surface is formed sufficiently finely so that only a single nucleus may grow, whereby a single crystal is grown selectively only at the site where such fine different kind of material exists.

Since the selective growth of single crystal is determined depending on the electron state of the deposition surface, particularly the state of dangling bond, the material with lower nucleation density (e.g. $SiO_2$) is not required to be a bulk material, but it may be formed only on the surface of any desired material or substrate, etc. to form the above deposition surface.

Figure 7A:
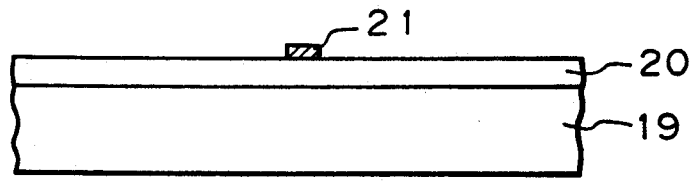
FIGS. 7(A)–7(D) are diagrams of the steps for illustration of the principle of the production process when forming practically a single crystal.
Figure 7B:
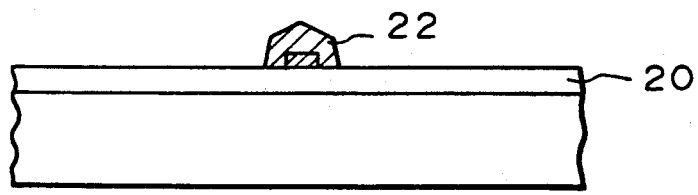
Figure 7C:
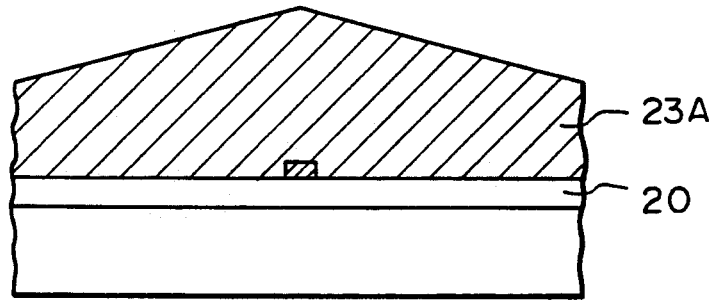
Figure 7D:
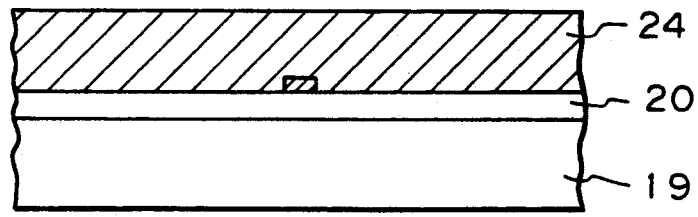
Figure 8A:
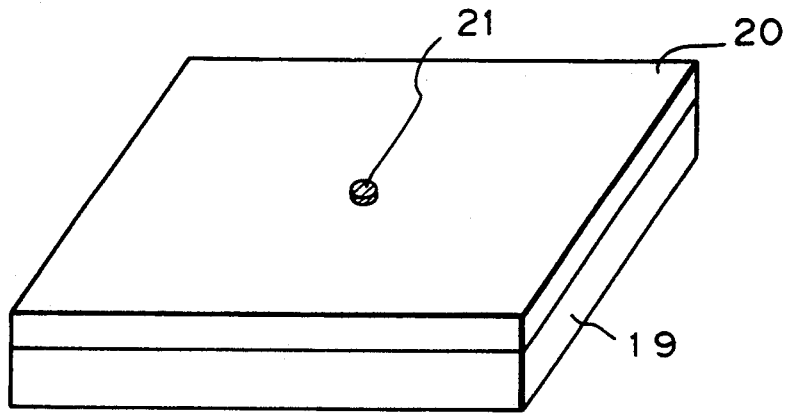
FIGS. 8(A) and 8(B) are perspective views of FIGS. 7(A) and 7(D).
Figure 8:
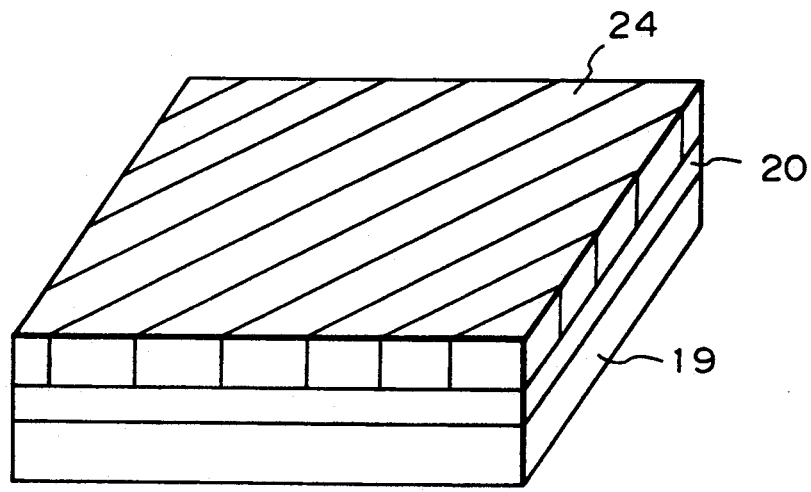

FIGS. 7(A)–7(D) illustrate diagramatically the steps for illustration of the principle of the production process when forming practically a single crystal, and FIGS. 8(A) and 8(B) are perspective views of FIGS. 7(A) and 7(D).

First, as shown in FIG. 7(A) and FIG. 8(A), on the substrate 19, a thin film with small nucleation density enabling selective nucleation [nucleation surface ($S_{NDS}$)] is formed, and a material of different kind from the material forming the thin film 20 with small nucleation density is thinly deposited thereon, followed by patterning by lithography, etc. to form sufficiently finely a nucleation surface comprising a different kind of material ($S_{NDL}$) (or called "Seed"). However, the size, the crystal structure and the composition of the substrate 19 may be as desired, and it may be also a substrate having a functional element formed thereon. Also, the nucleation surfaces ($S_{NDL}$) 21 comprising a different kind material is inclusive of modified regions having excessively Si, N, etc. formed by ion implantation of Si, N, etc. on the thin film 21, as described above.

Next, by selecting appropriate deposition conditions, a single nucleus of a thin film material is formed only on the nucleation surface ($S_{NDL}$) 21. That is, the nucleation surface ($S_{NDL}$) 21 is required to be formed sufficiently small to the extent that only a single nucleus may be formed. The size of the nucleation surface ($S_{NDL}$), which depends on the kind of material, may be several microns or less. Further, the nucleus grows while maintaining a single crystal structure to become a single crystal grain 22 shaped in an island as shown in FIG. 7(B). For the island-shaped single crystal grain 22 to be formed, it is desirable to determine the conditions so that no nucleation may occur at all on the thin film 20.

The island-shaped single crystal grain 22 further grows while maintaining the single crystal structure with the nucleation surface ($S_{NDL}$) 21 as the center (lateral overgrowth), whereby the thin film 20 can be wholly covered therewith as shown in FIG. 7(C) (single crystal 23A).

Subsequently, the single crystal 23A is flattened by etching or polishing to form a single crystal layer 24 on the thin film 20, on which a desired element can be formed, as shown in FIG. 7(D) or FIG. 8(B).

Thus, since the thin film 20 constituting the non-nucleation surface ($S_{NDS}$) is formed on the substrate 19, any desired material can be used for the substrate 19 which is the supporting member. Further, in such case, even if the substrate 19 may be one having a functional element, etc. formed by a conventional semiconductor technique, a single crystal layer 24 can be easily formed thereon.

In the above embodiment, the non-nucleation surface ($S_{NDS}$) was formed with the thin film 21, but a substrate comprising a material with small nucleation density (ND) enabling selective nucleation may be used as such, and the single crystal layer may be formed similarly with provision of the nucleation surface ($S_{NDL}$) at any desired position.

Figure 9:
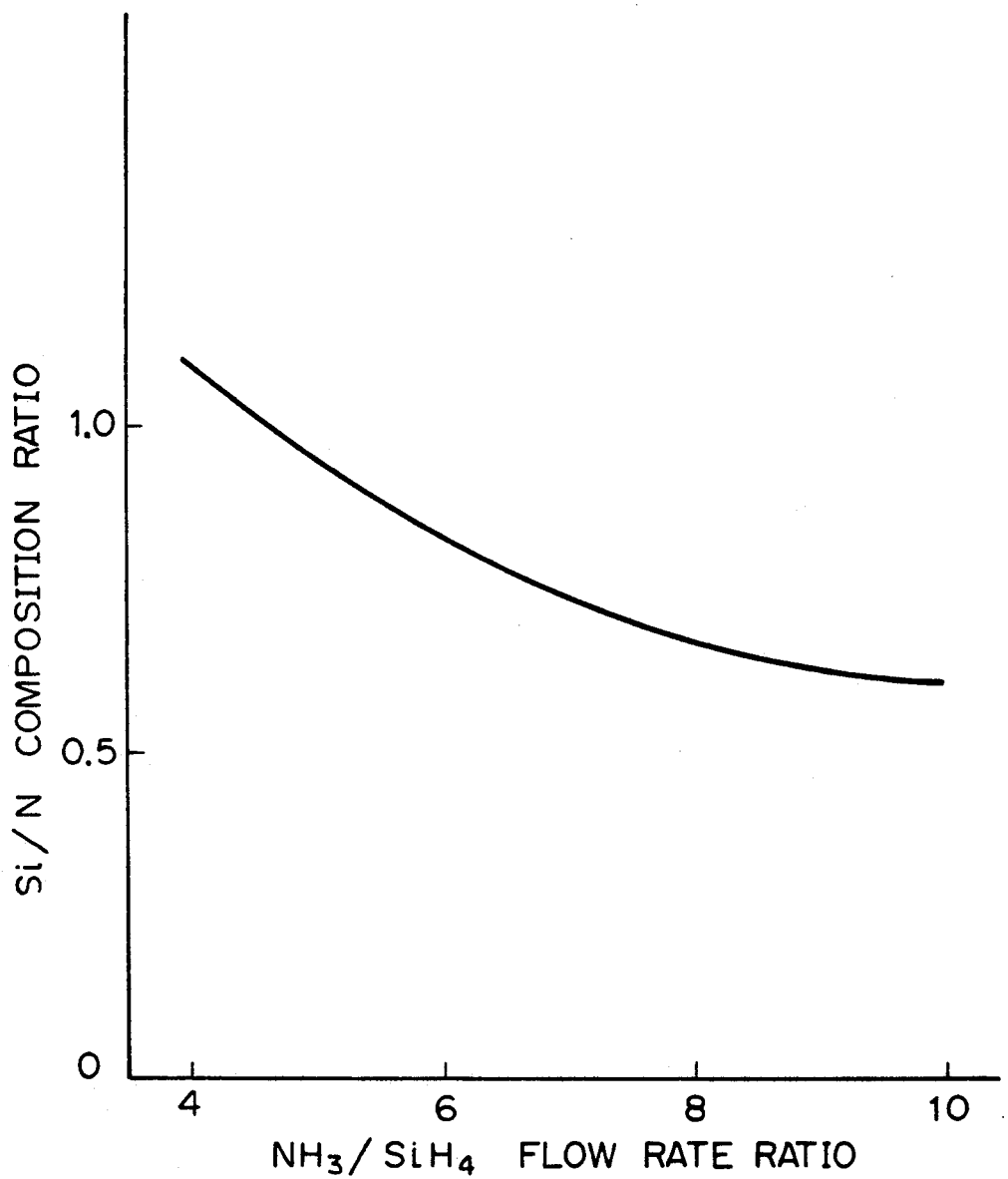
FIG. 9 is a graph showing one example of the relationship between the flow rate ratio of $NH_3$ to $SiH_4$ and the composition ratio of Si/N in the silicon nitride film formed.

FIG. 9 is a graph showing one example of the relationship between the flow rate ratio of $NH_3$ to $SiH_4$ and the composition ratio of Si/N in the silicon nitride film formed.

The deposition conditions at this time were RF output of 175 W, substrate temperature of 380° C., and the $SiH_4$ gas flow rate was fixed at 300 cc/min., with the flow rate of $NH_3$ gas being varied. As shown in the same graph, by varying the gas flow rate ratio of $NH_3/SiH_4$ from 4 to 10, the Si/N ratio in the silicon nitride film was found to vary from 11 to 1.58, as clarified by the Auger's electron spectroscopy.

Also, the composition of the silicon nitride film formed according to the reduced pressure CVD method by introducing $SiH_2Cl_2$ gas and $NH_3$ gas under the conditions of a reduced pressure of 0.3 Torr and a temperature of about 800° C., was found to be approximate to $Si_3N_4$ (Si/N=0.75) which is substantially the stoichiometric ratio.

Also, the silicon nitride film formed by heat treatment at about 1200° C. in ammonia or $N_2$ (hot nitriding method) can obtain a composition further approximate to the stoichiometric ratio, because the formation method is practiced under thermal equilibrium.

By use of the silicon nitride formed according to various methods as described above as the material for forming the nucleation surface ($S_{NDL}$) with higher nucleation density of Si than $SiO_2$, the above nucleus of Si can be permitted to grow on the nucleation surface ($S_{NDL}$) comprising silicon nitride, whereby a Si single crystal is formed based on the nucleation density difference ($\Delta ND$) corresponding to the chemical composition ratio of silicon nitride.

Figure 10:
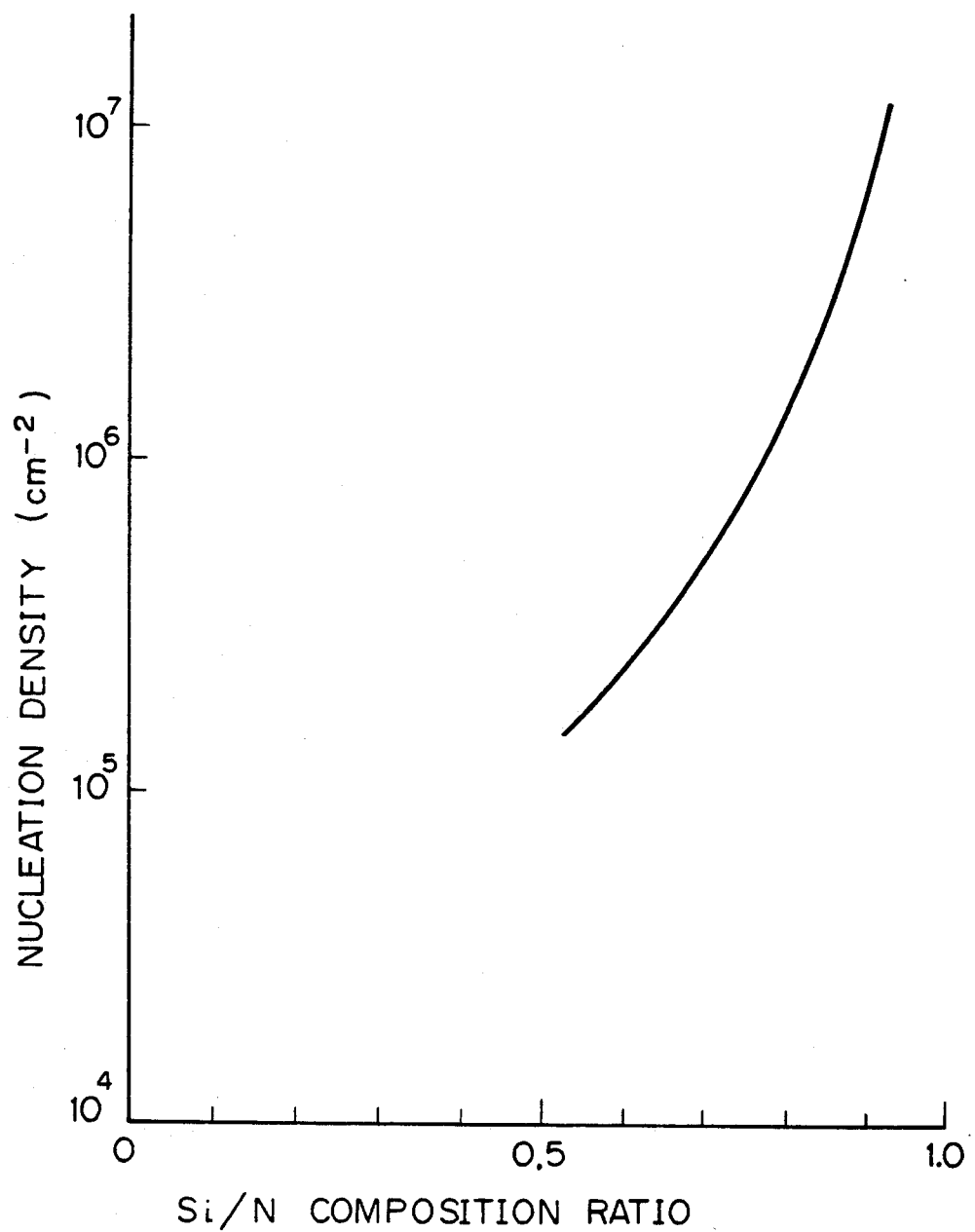
FIG. 10 is a graph showing the relationship between the Si/N composition ratio and the nucleation density (ND).

FIG. 10 is a graph showing the relationship between Si/N composition ratio and nucleation density (ND). As shown in FIG. 10, by varying the chemical composition ratio of the silicon nitride film, the nucleation density of the Si single crystalline nucleus formed thereon varies to great extent. The nucleation conditions in the graph in FIG. 10 correspond to the case when $SiCl_4$ gas is reduced to 175 Torr, and reacted with $H_2$ at 1000° C. to form Si single crystalline nuclei. Of course, another graph will be obtained if nucleation conditions such as gas species, pressure, temperature, etc. are varied.

Thus, the phenomenon of the nucleation density being varied depending on the chemical composition of silicon nitride has an influence on the size (area) of the nucleation surface ($S_{NDL}$), when silicon nitride is used as the material for forming the nucleation surface ($S_{NDL}$) which is to be formed sufficiently fine to the extent that a single crystal is permitted to grow. More specifically, when silicon nitride having a composition with large nucleation density (ND) is used, by forming the nucleation surface ($S_{NDL}$) extremely finely as compared with the case of silicon with relatively smaller nucleation density (ND) than that, only a single nucleus can be formed on the nucleation surface ($S_{NDL}$).

Such points are also applicable to other materials for forming the nucleation surface ($S_{NDL}$) having the same tendency.

Accordingly, in the present invention, for effectively accomplishing its objects, it is desirable that the nucleation density (ND) and the size of the nucleation surface ($S_{NDL}$) should be selected suitably as desired. For example, under the nucleation conditions for obtaining a nucleation density (ND) of ca. $10^5 cm^{-2}$, the size of the nucleation surface ($S_{NDL}$) may be about 4 $\mu m$ or less, whereby only a single nucleus can be selectively formed.

In that case, the Si/N composition ratio is about 0.5.

As another method for realizing the nucleation density difference ($\Delta ND$) in the case of forming a Si single crystalline, a modified region with a desired size can be formed on the $SiO_2$ layer surface by ion implantation of Si, N, P, B, F, Ar, He, C, As, Ga, Ge, etc. locally on the surface of a layer comprising $SiO_2$ which is the material for forming the non-nucleation surface ($S_{NDS}$) with small nucleation density to make the modified region the nucleation surface with larger nucleation density (ND) ($S_{NDL}$).

For example, the $SiO_2$ surface may be covered with a resist, and the desired sites are exposed, developed and dissolved to have the $SiO_2$ surface exposed partially.

Subsequently, by use of $SiF_4$ gas as the source gas, Si ions are implanted at 10 keV at a density of $1 \times 10^{16}$ to $1 \times 10^{18} cm^{-2}$.

The projection flight length in this case is 114 Å, and the Si concentration reaches ca. $10^{22}$ cm$^{-3}$ on the SiO$_2$ surface. Since SiO$_2$ layer is originally amorphous, the modified region implanted with Si ions to be made Si excessive is also amorphous.

For formation of a modified region, ion implantation can be effected with a resist as the mask, but narrowed Si ions may be also implanted onto the desired position within the desired area on the SiO$_2$ surface without use of a resist mask by use of the converged ion beam technique.

After ion implantation is thus effected, the resist can be peeled off to form a modified region with excessive Si on the SiO$_2$ surface at the desired position with a desired size. On the SiO$_2$ deposition surface having such modified region formed thereon, Si single crystal is permitted to grow in gas phase.

Figure 11:
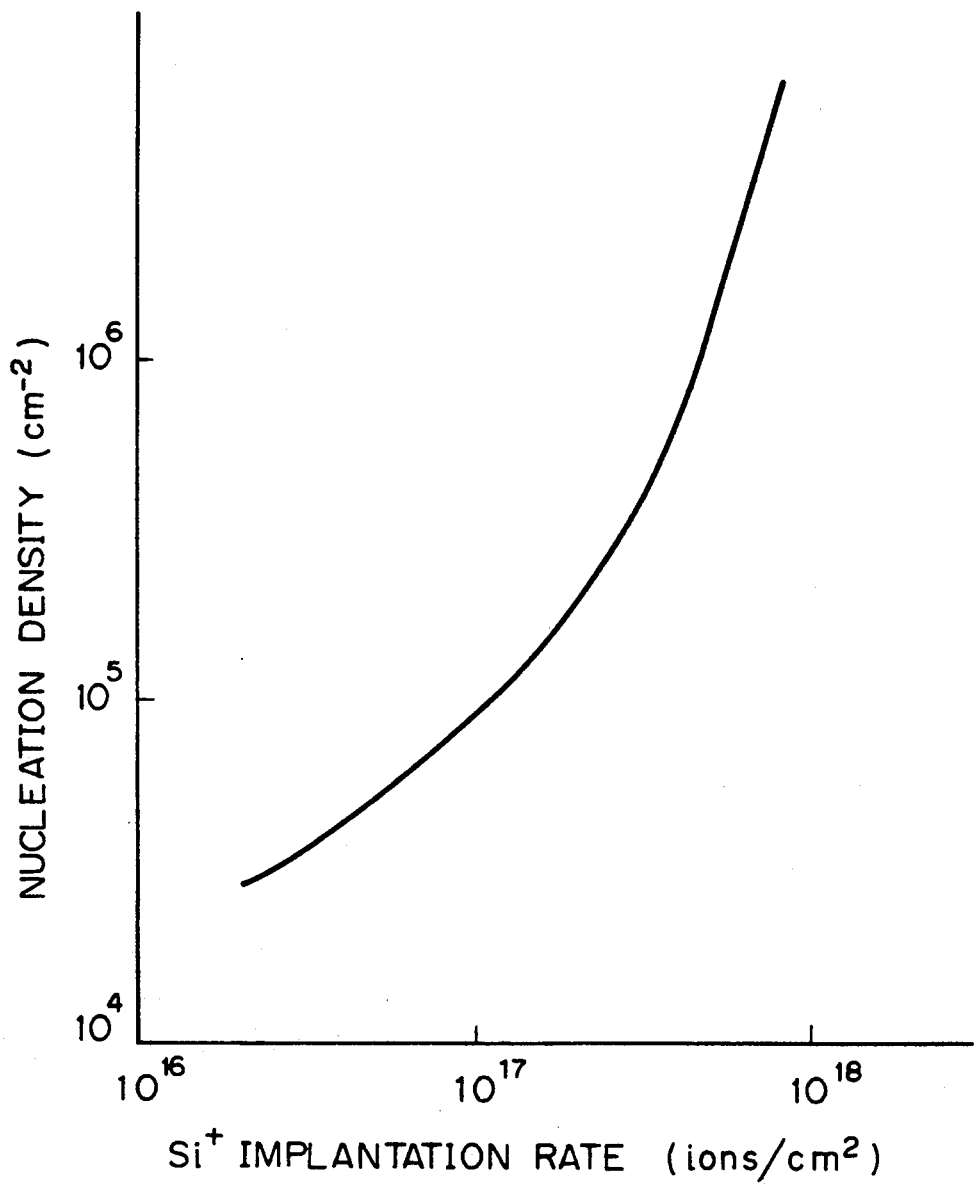
FIG. 11 is a graph showing the relationship between the Si ion implantation rate and the nucleation density (ND).

FIG. 11 is a graph showing the relationship between Si ion implantation rate and nucleation density.

As shown in FIG. 11, it can be understood that nucleation density (ND) is increased as the amount of Si$^+$ implanted is larger.

Accordingly, by forming sufficiently finely the modified region, only a single nucleus of Si can be grown with the modified region as the nucleation surface ($S_{NDL}$), whereby a single crystal can be grown as described above.

Sufficiently fine formation of the modified region to the extent that a single nucleus can grow can be accomplished easily by patterning of a resist or narrowing of the beam of the converged ion beam.

For growth of a single crystal by selective nucleation of Si, the CVD method is not limitative, but it is also possible to use the method in which Si is evaporated by an electron gun in vacuum ($<10^{-6}$ Torr) to be deposited on a heated substrate. Particularly, according to the MBE (Molecular Beam Epitaxy) method in which vapor deposition is effected in ultra-high vacuum ($<10^{-9}$ Torr), it has been known in the art that the reaction begins between Si beam and SiO$_2$ at a substrate temperature of 900° C. or higher, whereby nucleation of Si becomes zero on SiO$_2$ (T. Yonehara, S. Yoshioka and S. Miyazawa, *Journal of Applied Physics* 53, 10, p6839, 1983).

By utilizing this phenomenon, a single nucleus can be formed on the fine silicon nitride existing in spots on SiO$_2$ with complete selectivity and single crystalline Si can be grown therefrom. The single crystal growth conditions as a suitable example at this time are vacuum degree of $10^{-8}$ Torr or less, Si beam intensity of $9.7 \times 10^{14}$ atoms/cm$^2$ sec, substrate temperature of 900° C. to 1000° C.

In this case, through the reaction SiO$_2$+Si→2SiO ↑, a reaction product with remarkably high vapor pressure of SiO is formed, whereby etching of SiO$_2$ itself with Si through such evaporation occurs.

In contrast, on silicon nitride, no such etching phenomenon occurs, but nucleation of Si single crystal, and growth of single crystal occurs.

Therefore, as the material with higher nucleation density (ND) for forming the nucleation surface ($S_{NDL}$), other than silicon nitride, tantalum oxide (Ta$_2$O$_5$), silicon nitride oxide (SiON), etc. can be also used to obtain the same effect. Thus, by forming these materials with a small area to form the above nucleation surface ($S_{NDL}$), single crystals of Si can be similarly grown.

What is claimed is:

1. A process for producing a crystal article on a substrate comprising the steps of:
   (i) providing a substrate having a concavity including an upper surface, a bottom surface, and a nucleation surface provided in said concavity, each of said surface composed of amorphous material, said nucleation surface consisting of an amorphous material which is capable of maintaining a nucleation density sufficiently greater than the amorphous material constituting the bottom surface of the concavity so as to be capable of having a single Si crystal formed thereon and having a surface area which is sufficiently small so as to permit the formation of a single Si crystal from a single nucleus, wherein said nucleation surface is formed by ion-implantation of Si, N, P, B, F, Ar, He, C, As, Ga, or Ge,
   (ii) applying vapor deposition to form said single crystal on said nucleation surface from said single nucleus, said single crystal having a surface portion, and
   (iii) simultaneously conducting mechanical polishing and chemical polishing by pressing said substrate provided with said single crystal against a polishing pad positioned on a rotary disc and applying a polishing liquid containing ethylenediamine pyrocatechol and water, thereby removing the surface portion of the single Si crystal formed over the upper surface of the concavity of said substrate.

* * * * *

UNITED STATES PATENT AND TRADEMARK OFFICE
CERTIFICATE OF CORRECTION

PATENT NO. : 5,269,876
DATED : December 14, 1993
INVENTOR(S) : HIDEMASA MIZUTANI It is certified that error appears in the above-identified patent and that said Letters Patent is hereby corrected as shown below:

ON TITLE PAGE

In [63] Related U.S. Application Data:
"Jul. 3, 1992" should read --Jul. 3, 1991--.

In [56] References Cited, under OTHER PUBLICATIONS:
"by Kow et al." should read --Novozhilov et al.-- and "Calclaser," should read --Colclaser,--.

In [57] ABSTRACT:
Line 8, "such" should read --such that--.

COLUMN 6

Line 19, "SiO2" should read --$SiO_2$--.

COLUMN 7

Line 50, "SiH4" should read --$SiH_4$--.

UNITED STATES PATENT AND TRADEMARK OFFICE
CERTIFICATE OF CORRECTION

PATENT NO. : 5,269,876
DATED : December 14, 1993
INVENTOR(S) : HIDEMASA MIZUTANI It is certified that error appears in the above-identified patent and that said Letters Patent is hereby corrected as shown below:

COLUMN 10

Line 25, "surface" should read --surfaces--.

Signed and Sealed this

Twentieth Day of September, 1994

Attest:

BRUCE LEHMAN

Attesting Officer

Commissioner of Patents and Trademarks